United States Patent [19]

White et al.

[11] Patent Number: 4,843,583

[45] Date of Patent: Jun. 27, 1989

[54] NONLINEAR ADAPTIVE FILTER

[75] Inventors: Stanley A. White, Orange; Visvaldis A. Vitols, Anaheim, both of Calif.

[73] Assignee: Rockwell International Corporation, El Segundo, Calif.

[21] Appl. No.: 787,811

[22] Filed: Oct. 15, 1985

[51] Int. Cl.[4] .......................................... G06F 15/31
[52] U.S. Cl. ............................................... 364/724.19
[58] Field of Search ................... 364/724, 825, 724.19, 364/724.2; 375/12, 14, 58, 103; 370/32.1; 379/406, 407, 410, 411

[56] References Cited

U.S. PATENT DOCUMENTS

| | | | |
|---|---|---|---|
| 4,000,369 | 12/1976 | Paul, Jr. et al. | 179/1 P |
| 4,041,411 | 8/1977 | Sturgeon | 330/271 |
| 4,044,600 | 9/1983 | Murakani | 375/14 |
| 4,052,559 | 10/1977 | Paul et al. | 179/1 P |
| 4,052,720 | 10/1977 | McGregor et al. | 340/420 |
| 4,059,052 | 11/1977 | Karr | 102/70.2 P |
| 4,098,370 | 7/1978 | McGregor et al. | 181/150 |
| 4,131,760 | 12/1978 | Christensen et al. | 387/66 |
| 4,262,209 | 4/1987 | Berner | 307/47 |
| 4,264,935 | 4/1981 | Lee | 360/45 |
| 4,315,319 | 2/1982 | White | 364/571 |
| 4,319,288 | 3/1982 | Lee | 360/46 |
| 4,459,698 | 10/1984 | Yumoto et al. | 364/724 |
| 4,481,643 | 11/1984 | Kitazawa | 375/12 |
| 4,507,741 | 3/1985 | White | 364/554 |
| 4,524,424 | 6/1985 | White | 364/724 |
| 4,615,038 | 9/1986 | Lim, deceased et al. | 364/724 |
| 4,633,482 | 12/1986 | Sari | 375/14 |

Primary Examiner—Gary V. Harkcom
Assistant Examiner—Dale M. Shaw
Attorney, Agent, or Firm—H. Frederick Hamann; G. A. Montanye; David J. Arthur

[57] ABSTRACT

A nonlinear adaptive filter has an input and an output, and includes an adjustable linear filter and nonlinear filter connected serially between the input and output. The parameters for the adjustable linear filter are derived from signals on the adaptive filter output and from signals on the adaptive filter input. Preferably, the adjustable linear filter is coupled between the adaptive filter input and the nonlinear filter. A parameter computer for adjusting the parameters of the adjustable linear filter includes an input coupled to the output of the nonlinear filter, a processor for processing a signal received from the output of the nonlinear filter, and apparatus for applying the processed output signal to the parameters of the adjustable linear filter. A linear filter for shaping the spectrum of a signal received from the output of the nonlinear filter is preferably coupled between the nonlinear filter output and the parameter computer. In its preferred form, the nonlinear filter portion includes a first processor for generating from an input signal an intermediate signal having a uniform amplitude-density function, and a second processor for generating from the intermediate signal an output signal having a desired amplitude-density function.

18 Claims, 7 Drawing Sheets

NONLINEAR ADAPTIVE FILTER

BACKGROUND OF THE INVENTION

The present invention relates to signal processors for correcting signal distortion by shaping the frequency spectrum and/or the amplitude-density function of the signal.

Signals transmitted from one point to another are subject to a number of distortion mechanisms.

One classical distortion mechanism is linear, or convolutional, distortion. A linear method of correction, called predictive deconvolution, has been developed to remove convolutional distortion from the signal by whitening the frequency spectrum of the signal. This method is described in U.S. Pat. No. 4,000,369, entitled "Analog Signal Channel Equalization With Signal-in-Noise Embodiment" (James E. Paul Jr. et al., Dec. 28, 1976) and U.S. Pat. No. 4,052,559, entitled "Noise Filtering Device" (James E. Paul Jr. et al., Oct. 4, 1977). In the method described in the second of those patents, additional spectrum shaping is done by a fixed passive filter in tandem with the predictive deconvolver to restore a natural shape to the spectrum. U.S. Pat. No. 4,507,741, "Adaptive Spectrum Shaping Filter" (Stanley A. White, Mar. 26, 1985) describes a more powerful filter for actively shaping the frequency spectrum of an input signal from any given initial form to any desired output form. Such processing is also linear.

A second distortion mechanism that can severely corrupt a transmitted signal is nonlinear distortion. U.S Pat. No. 4,315,319, "Nonlinear Signal Processor" (Stanley A. White and V. A. Vitols Feb. 9, 1982) describes a nonlinear signal-processing technique to combat the problem of nonlinear distortion by mapping an input signal having any given amplitude-density function into a new signal with any desired amplitude-density function, subject only to the constraint that the distorting mechanism be a single-valued nonlinear function, the slope of which is everywhere positive. The nonlinear signal-processing technique of that patent has been successfully applied to both speech and image-restoration problems.

Nevertheless, some problems in actual signal transmission remain. Most signals are in fact subjected to both convolutional (linear) and nonlinear distortion. Yet, it has been found that attempting to restore the signal by coupling two correction devices together in series has not worked successfully. A linear filter followed by a nonlinear filter shapes the frequency spectrum first, then corrects the amplitude-density function. Unfortunately, shaping the amplitude-density function changes the frequency spectrum established by the linear filter. A nonlinear filter followed by a linear filter corrects the amplitude-density function first, then shapes the frequency spectrum. However, the frequency-shaping function of the linear filter modifies the desired amplitude-density function established by the nonlinear filter, except in the case of a Gaussian-shaped density function.

SUMMARY OF THE INVENTION

The nonlinear adaptive filter of the present invention shapes both the frequency spectrum and the amplitude-density function essentially simultaneously.

The present invention is a signal processor having an input and an output. The signal processor includes a nonlinear filter and a linear filter connected serially between the processor input and the processor output. The parameters for the linear filter are derived from signals on the processor output and signals on the processor input.

The parameters for the linear filter are preferably computed by a parameter computer connected to the processor input and to the processor output. A linear filter is preferably connected between the processor output and the parameter computer.

In one preferred embodiment of the signal processor, the input of the linear filter is connected to the processor input and the input of the nonlinear filter is connected to the output of the linear filter.

DESCRIPTION OF THE PREFERRED EMBODIMENTS

Figure 1:
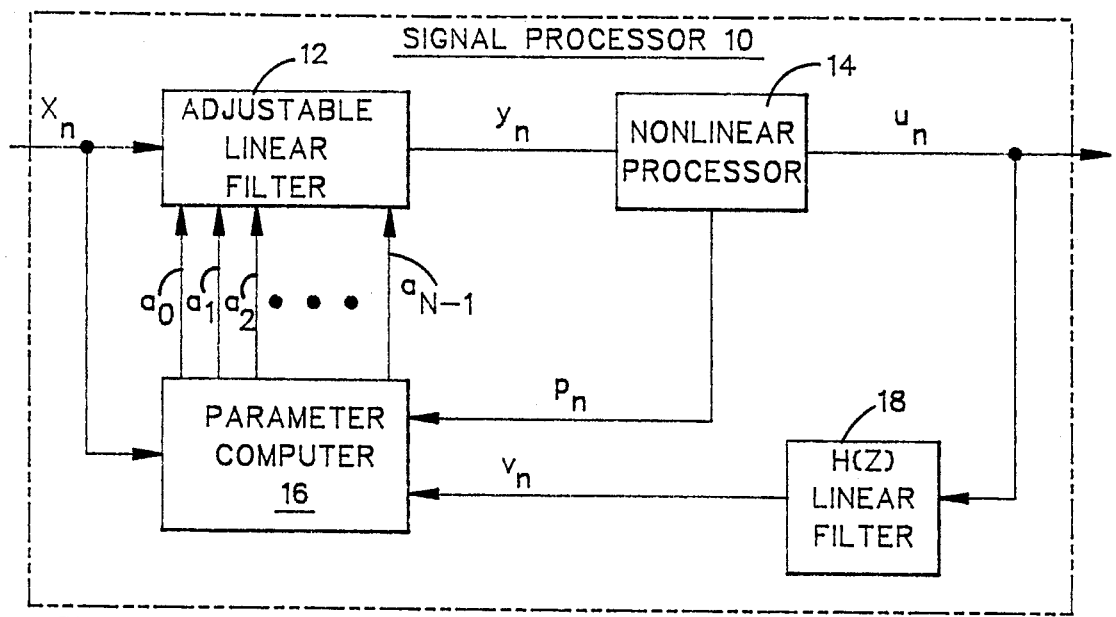
FIG. 1 is a simplified block diagram of a preferred embodiment of the signal-shaping processor of the invention.

A preferred embodiment of the nonlinear adaptive filter signal processor of the invention is shown generally in the block diagram of FIG. 1. An input signal $x_n$ is input to a first signal processor such as adjustable linear filter 12. The output from this adjustable linear filter, $y_n$, is input to a second signal processor such as a NONLINEAR PROCESSOR 14. The output signals from the NONLINEAR PROCESSOR 14 are designated $u_n$, the output signal; and $p_n$, a feedback control signal.

The control signals for the adjustable linear filter 12 are the input signal, $x_n$; the feedback control signal $u_n$; and a third signal which is derived from the output signal $u_n$ to enable the ADJUSTABLE LINEAR FILTER 12 to shape the spectrum of the output signal $u_n$ through the NONLINEAR PROCESSOR 14. The tap weight inputs for ADJUSTABLE LINEAR FILTER 12 are controlled by PARAMETER COMPUTER 16. The PARAMETER COMPUTER 16 is fed by a third signal $v_n$, which is the output of a LINEAR FILTER 18 coupled to output signal $u_n$.

The ADJUSTABLE LINEAR FILTER 12 may be of a type known in the art. One particularly advantageous transversal filter and associated parameter computer for spectral whitening and suppression is described in U.S. Pat. No. 4,000,369, issued Dec. 28, 1976 to James E. Paul, Jr., et al and entitled "Analog Signal Channel Equalization with Signal-in-Noise Embodiment". The adjustable linear filter 12 is described by the input/output characteristic for convolution sum:

$$y_n = \sum_{k=0}^{N-1} a_k x_{n-k} \qquad (1)$$

and is sometimes referred to as a transversal or FIR filter. Thus, the ADJUSTABLE LINEAR FILTER 12 has a coefficient or parameter vector $$a = [a_0, a_1, \ldots a_{N-1}]^T \qquad (2)$$

which may be adjusted by an amount $\Delta a$ in one sample time.

The NONLINEAR PROCESSOR 14 coupled to the output of the linear filter causes the amplitude-density/distribution function of the output signal $u_n$ to have a prescribed form, without respect to the frequency spectrum. The shaping process is reversible.

Figure 2:
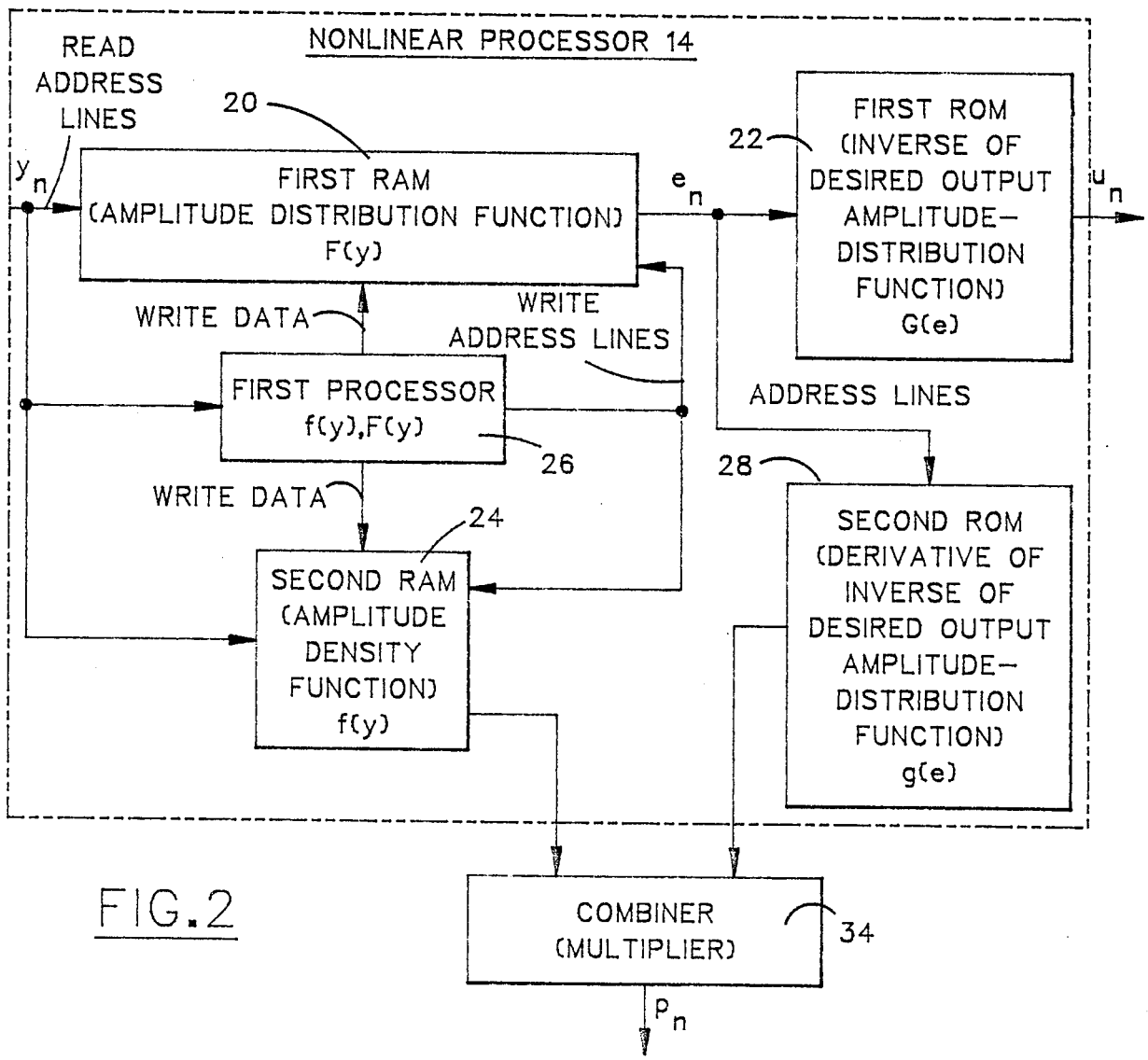
FIG. 2 is a block diagram of the memoryless adjustable single-valued nonlinear signal-processor portion of the processor shown in FIG. 1.

Referring now to FIG. 2, the NONLINEAR PROCESSOR 14 may be conceptualized as a pair of processors 20, 22 performing tandem functions F and G to first give the signal a uniform amplitude-density function, then to shape the signal to have the desired amplitude-density function. The output $y_n$ from the adjustable linear filter 12 that is input to the NONLINEAR PROCESSOR 14 has an arbitrary amplitude-density/distribution function. The FIRST PROCESSOR 26 of the NONLINEAR PROCESSOR 14 operates as an amplitude density/distribution function computer and stores the actual amplitude-distribution function of y, F(y) into RAM 20 in order, to generate a signal $e_n = F(y_n)$ having a uniform, or flat, amplitude-density function. The first processor 26 preferably comprises a random-access memory such as RAM 20 for storing the amplitude-distribution function F(y). The intermediate signal $e_n$ addresses a ROM, such as ROM 22 for shaping the amplitude-density function. ROM 22 is pre-programmed to contain function G(e), a function which is the inverse of the desired output amplitude-distribution function, G(e). The output signal $u_n$ from the ROM 22 has the prescribed amplitude-density/distribution function.

FIRST PROCESSOR 26 forms the amplitude-density function, in real time, of $y_n$, called f(y). The amplitude-density function f(y) is stored in a second random-access memory 24. The integral of f(y), called F(y), is formed in FIRST PROCESSOR 26. The integral of f(y), i.e. F(y) is the accumulation of the real-time histogram of the sequence $\{y_n\}$, as described in U.S. Pat. No. 4,315,319, issued Feb. 9, 1982 to V. A. Vitols and S. A. White for a "Nonlinear Signal Processor". A further refinement of the technique is described in U.S. Pat. No. 4,507,741, issued Mar. 26, 1985 to Stanley A. White for a "Computing Device".

The integral function F(y) is stored in the first random-access memory 20 of the NONLINEAR PROCESSOR 14. This random-access memory then contains the actual amplitude-distribution function of the input signal y. The function F(y) is used as a nonlinear map to form the intermediate signal $e_n$. Signal $e_n$ functions as a series of addresses for ROM 22 and ROM 28. The input $y_n$ is the address for SECOND RAM 24, FIRST RAM 20, from which the output $e_n = F(y_n)$ is read, and is the input to FIRST PROCESSOR 26.

Each output signal $e_n$ from the FIRST RAM is used to address FIRST ROM 22 memory location containing the inverse of the amplitude-distribution function desired for the output signal $u_n$. A second ROM 28 contains the derivative function dG/de the derivative of the inverse of the desired output amplitude distribution function. The technique of performing these functions is also described in the just-referenced U.S. Pat. Nos. 4,315,319 and 4,507,741. The purpose of the derivative function will be explained below.

Figure 3:
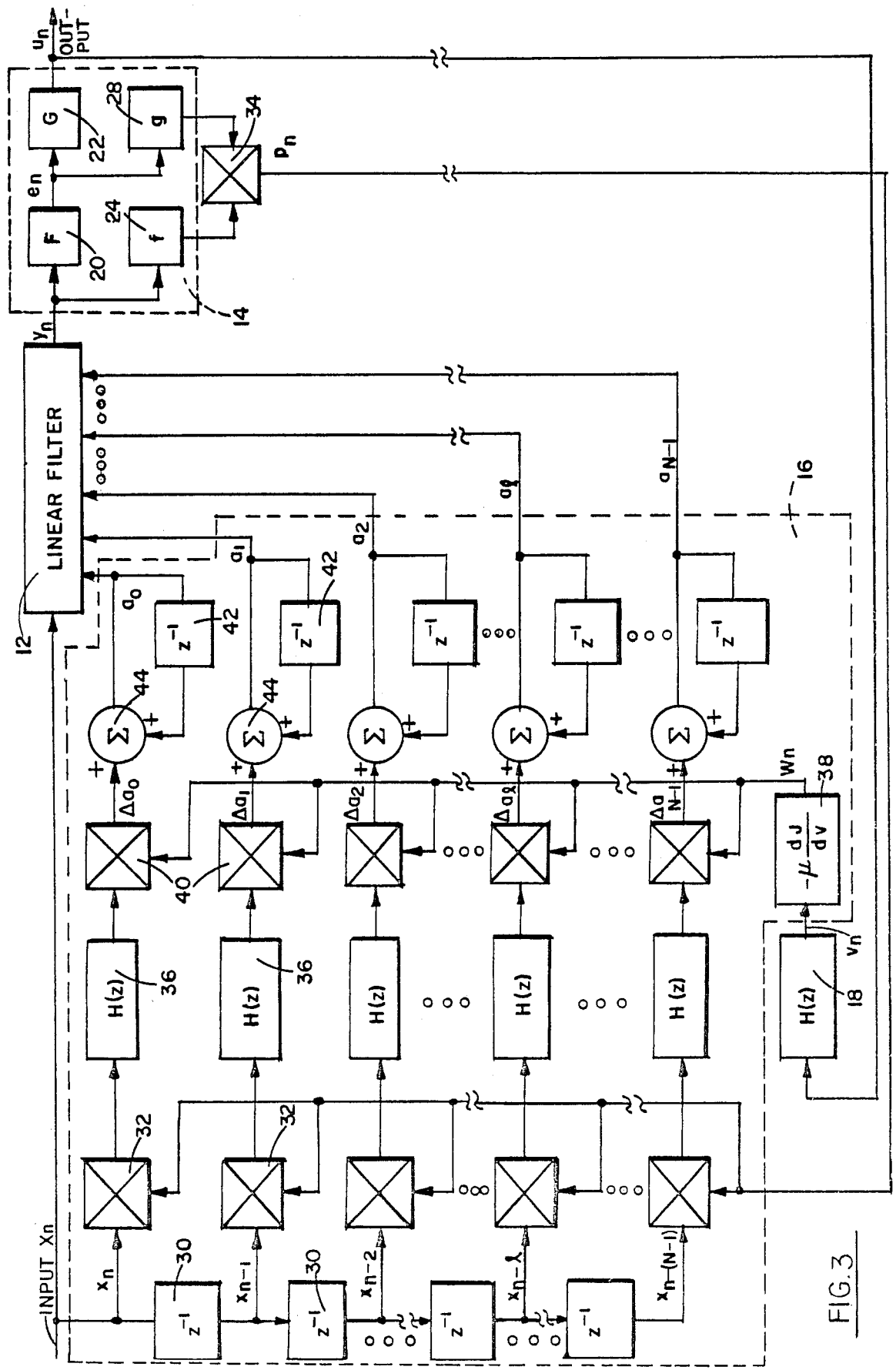
FIG. 3 is a block diagram showing in greater detail a preferred form of the adaptive nonlinear filter of the invention.

Referring now to FIG. 3, the PARAMETER COMPUTER 16 of FIG. 1 is shown in greater detail, with the control loops for adjusting the parameters of the adjustable linear filter. Input signal $x_n$ enters the linear filter 12, which, at a given time has a tap weight vector $a = [a_0, a_1 \ldots, a_{N-1}]^T$. The tap weights or parameters of the linear filter are calculated by the parameter computer.

The parameter computer 16 calculates, in each sample time, the change $\Delta a_0, \Delta a_1, \ldots, \Delta a_{N-1}$ to be made in each filter parameter $a_0, a_1 \ldots, a_{N-1}$, respectively. These new values of the parameters are calculated based in part on the output signal $u_n$ in a manner designed to provide the desired frequency spectrum.

The PARAMETER COMPUTER 16 uses as its inputs the system input signal $x_n$, the product of the actual amplitude-density function $f(y_n)$ and the derivative $g(e_n)$ of the desired amplitude-distribution function $G(e_n)$, and a signal $v_n$ that is obtained by filtering the output $u_n$ through the linear filter H(z) 18. The computation process is here described.

In the parameter computer 16, the input signal $x_n$ is applied to a delay line comprising a series of delay elements 30. At the output of each delay element, and at the input to the first delay element, the signal is tapped. Each tapped signal from the delay lines is multiplied together in a first signal combiner or multiplier 32 with a signal $p_n$ obtained by multiplying the actual amplitude-density function of y, $f(y_n)$, and the derivative of the inverse of the desired amplitude-distribution function, $g(e_n)$, in a combiner 34 coupled to the nonlinear filter 14.

The product output from each multiplier 32 is processed by a linear filter H(z) 36. The filtered output is multiplied with a signal $w_n$, which is derived from the output signal $u_n$. The signal $w_n$ is obtained from the NONLINEAR PROCESSOR 14 output $u_n$ by filtering the output signal $u_n$ through a linear filter H(z) 18 to obtain a signal $v_n$. Signal $v_n$ is applied to a processor 38. Processor 38 applies an adjustment-rate parameter and the derivative of the functional $J(v_n)$ with respect to v to $v_n$ to obtain $w_n$.

The signal $w_n$, obtained from the output signal $u_n$, is combined in a plurality of second signal combiners 40 with the outputs of the filters H(z) 36 within the parameter computer to form the parameter adjustments $\Delta a_0, \Delta a_1, \ldots, \Delta a_l, \ldots \Delta a_{N-1}$. Adjustment parameters $\Delta a_0, \Delta a_1, \ldots \Delta a_l, \ldots \Delta a_{N-1}$ are summed in summers 44 with the preexisting parameters $a_0, a_1, \ldots a_l, \ldots a_{N-1}$, delayed the proper time by delay elements 42 to produce new filter parameters for the new sample time.

If the function H(z) of the filter 18 is properly related to the desired output power spectrum, and the signal $v_n$ has the proper power spectrum, the output signal $u_n$ will have the desired spectrum.

In one exemplary form, the desired output power spectrum, within the allowable frequency range $$0 \leq \omega \leq (\omega_s/2) \qquad (3)$$

where $\omega_s$ is the sampling frequency, may be defined as $$|D(\omega)|^2 = |H(e^{j\omega T})|^{-2} \qquad (4)$$

in which H(z) is a stable filter and $h_n = z^{-1}[H(z)]$. Passing the sequence $\{u_n\}$ through the filter H(z) forms the sequence $\{v_n\}$ as follows:

$$v_n = u_n * h_n \qquad (5)$$

in which * is the convolution operator. If the power spectrum of $\{v_n\}$ has a uniform, or white, power spectrum, then $\{u_n\}$ will have the desired spectrum because of the way in which $H(e^{j\omega T})$ is defined.

A processor produces $w_n$ by applying to the signal $v_n$ the function $$w_n = -\mu \frac{dJ_n}{dv_n} \qquad (6)$$

where $J_n$ is the functional $J(v_n)$. The spectrum of the signal $v_n$ is whitened when $\{v_n\}$ is minimized in some sense such that the functional $J(v_n)$ is minimized.

As only the parameters $a_0, a_1, \ldots a_{N-1}$ of the linear filter may be adjusted, the functional $J(v_n)$ is minimized over the vector a by applying the standard gradient approach using the steepest-descent criterion, i.e.:

$$\Delta a = -\mu J(v_n) \qquad (7)$$

where $\Delta a$ is the adjustment to the linear-filter-parameter vector
$a = [a_0, a_1, \ldots a_{N-1}]^T$ in one sample time, $-\mu$ is the adjustment-rate parameter, and the gradient vector is $$\nabla J(v_n) = \frac{\partial J(v_n)}{\partial a} = \frac{\partial J_n}{\partial a} \qquad (8)$$

By the chain rule, expression (8) may be written in terms of a measurable parameter, $v_n$:

$$\frac{\partial J_n}{\partial a} = \frac{dJ_n}{dv_n} \frac{\partial v_n}{\partial a} \qquad (9)$$

if the linear filter H(z) is defined as a general linear recursive filter:

$$H(z) = \frac{\sum_{k=0}^{M-1} b_k z^{-k}}{1 - \sum_{k=1}^{N-1} c_k z^{-k}} \qquad (10)$$

Therefore, the signal $v_n$, which is the output signal $u_n$ processed by the filter H(z), is $$v_n = \sum_{k=0}^{M-1} b_k u_{n-k} + \sum_{k=1}^{N-1} c_k v_{n-k} \qquad (11)$$

The vector gradient of expression (11), is $$\frac{\partial v_n}{\partial a} = \sum_{k=0}^{M-1} b_k \frac{\partial u_{n-k}}{\partial a} + \sum_{k=1}^{N-1} c_k \frac{\partial v_{n-k}}{\partial a} \qquad (12)$$

Because the output signal $u_n$ is the output of the function $G(e_n)$, the function $g(e_n)$ is the derivative of the function $G(e_n)$, and the signal $e_n$ in the nonlinear filter is the output of the function F(y), then $$u_n = G(e_n) \qquad (13)$$

and $$e_n = F(y_n) \qquad (14)$$

The gradients of the output signal $u_n$ and the nonlinear filter intermediate signal $e_n$ are:

$$\frac{\partial u_n}{\partial a} = \frac{dG}{de_n} \frac{\partial e_n}{\partial a} = g_n \frac{\partial e_n}{\partial a} \qquad (15)$$

and $$\frac{\partial e_n}{\partial a} = \frac{dF}{dy_n} \frac{\partial y_n}{\partial a} = f_n \frac{\partial y_n}{\partial a} \qquad (16)$$

The relationship between the gradients of the output signal $u_n$ and the output of the adjustable linear filter is:

$$\frac{\partial u_n}{\partial a} = f_n g_n \frac{\partial y_n}{\partial a} \qquad (17)$$

As stated above in Expression (1), the adjustable linear filter is of the form $$y_n = \sum_{k=0}^{N-1} a_k x_{n-k} \qquad (1)$$

Therefore, the partial derivative of the signal $y_n$ with respect to a given linear filter parameter $a_l$ is $$\frac{\partial y_n}{\partial a_l} = x_{n-l} \qquad (18)$$

From expressions (17) and (18) it follows that:

$$\frac{\partial u_{n-k}}{\partial a_l} = (f_{n-k} g_{n-k}) x_{n-k-l} = p_{n-k} x_{n-k-l} \qquad (19)$$

From expressions (7), (8), and (9), the change $\Delta a_l$ for a linear filter parameter $a_l$ is:

$$\Delta a_l = -\mu \frac{dJ_n}{dV_n} \frac{\partial v_n}{\partial a_l} = w_n \frac{\partial v_n}{\partial a_l} \qquad (20)$$

As noted above in Expression (6):

$$w_n = -\mu \frac{dJ_n}{dv_n} \qquad (6)$$

Simple functions for $(dJ_n)/(dv_n)$ and their interpretation are well known and are discussed in S. A. White, "Digital Adaptive Element Building Blocks for MOS Large-Scale Integration", *IEEE Trans.*, Vol. C-18, No.

8, Aug. 1969, pp. 699–706, and S. A. White, "An Adaptive Recursive Digital Filter", *Proc. 9th Asilomar Conference on Circuits, Systems, and Computers,* Pacific Grove, CA, Nov. 1975, pp. 21–25.

From the above, it is seen that the adaptive filter of FIG. 3 correctly shapes both the frequency (power) spectrum of the output signal $u_n$ and also applies the proper amplitude-density function.

Several special application embodiments of the signal-shaping processor of the invention are possible for specific applications in which one or more of the processor functions F(y), G(e), or H(z) may be unitary.

Figure 4:
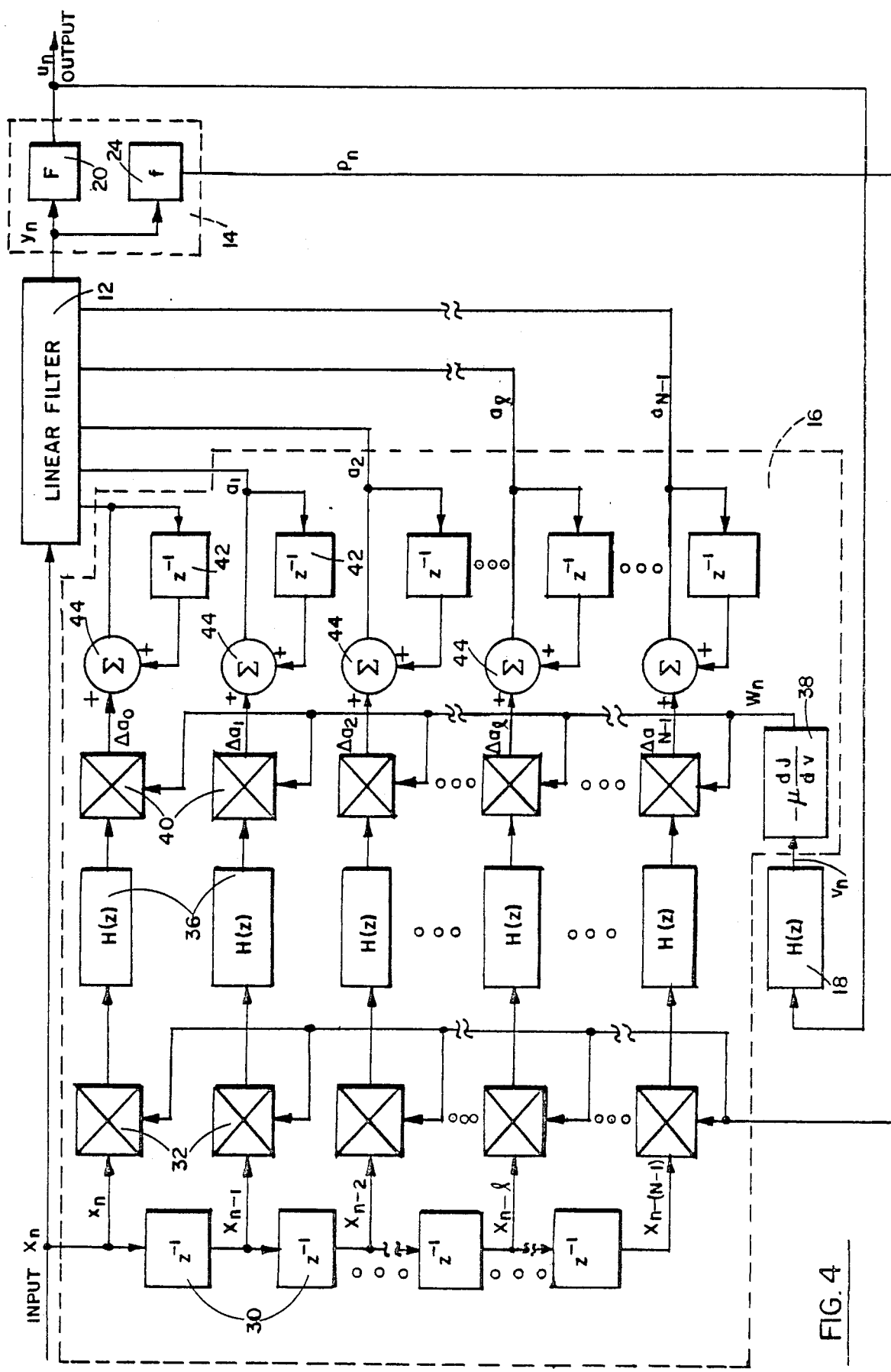
FIG. 4 is a block diagram of a signal-shaping processor for producing an output signal having a uniform amplitude-density function.

One special application filter generates an output signal $u_n$ having a uniform amplitude-density function. The inverse of the amplitude-distribution function desired for the output signal $u_n$ (G(e)) is unitary, but the actual amplitude-distribution function F(y) of the signal y and the filter function H(z) are nontrivial. In this case, the filter can take the form shown in FIG. 4. The output signal $u_n$ is the same as the signal $e_n$ output from the amplitude-distribution function F(y). The output power spectrum will be $|H(e^{j\omega T})|^{-2}$.

Figure 5:
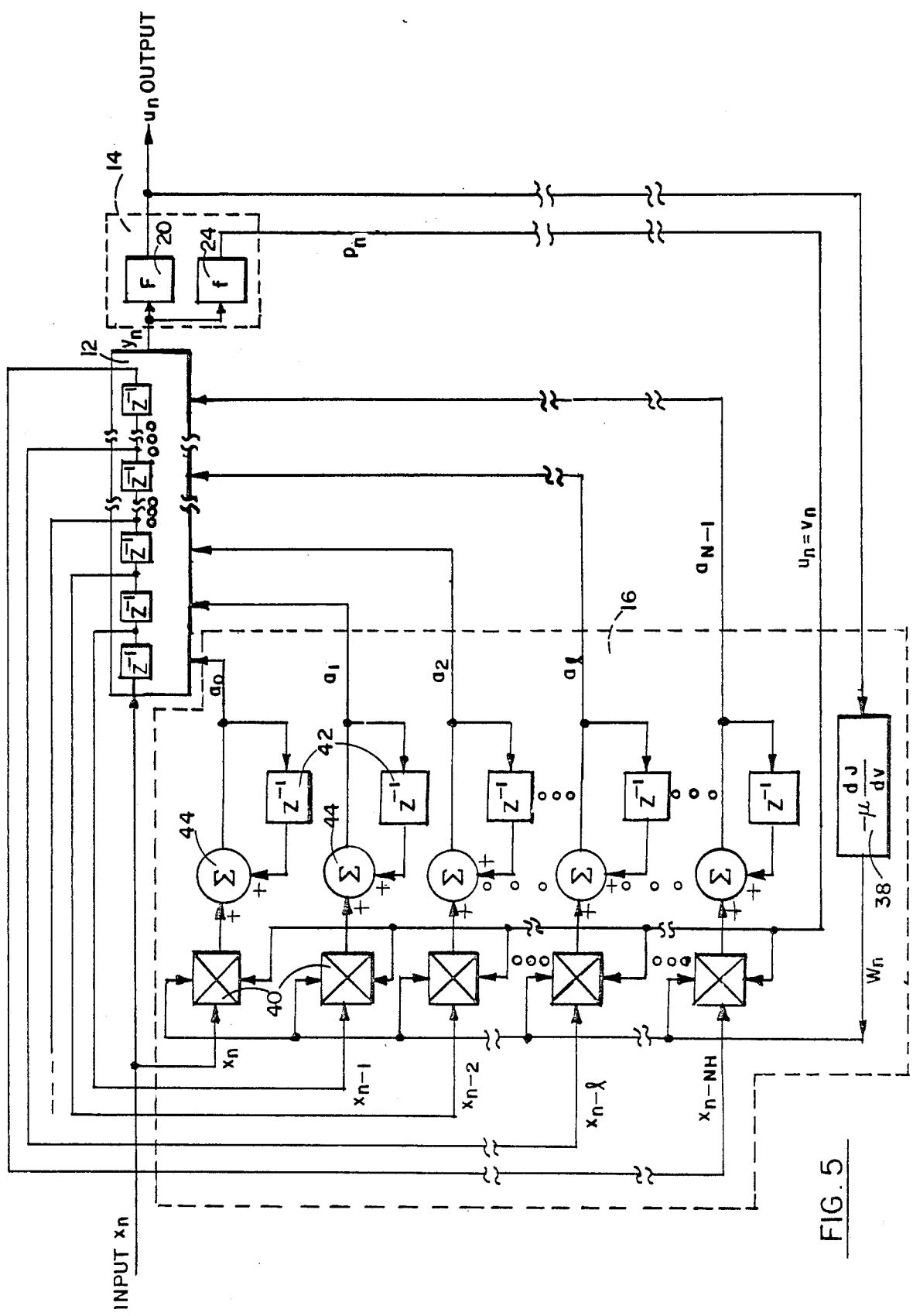
FIG. 5 is a block diagram of a maximum-entropy encoder for producing an output signal having a uniform amplitude-density function and a uniform power spectrum.

A second special case arises when both the inverse of the desired amplitude-distribution function (G(e)) and the filter function H(z) are unitary, but the actual amplitude-distribution function F(y) of the output $y_n$ from the linear filter is nontrivial. The filters H(z) on the adjustment lines for the linear filter can be eliminated. The resulting structure is shown in FIG. 5. The circuit is a maximum entropy encoder, for which both the amplitude-density function and the power spectrum of the output signal $u_n$ are uniform. The tapped delay line of the parameter computer 16 need not be a separate structure. The delayed values of $x_n$ may be obtained from within the adjustable linear filter 12 itself, in the same fashion that conventional adaptive FIR filters are mechanized. Because of the unitary filter function H(z), the input signals $x_n, x_{n-1}, \ldots x_{n-(N-1)}$ tapped from the delay line of the adjustable linear filter 12 may be combined directly in the combiners 40 with the signal $w_n$ from the processor 38 and with the signal $p_n$ directly from the processor 24.

Figure 6:
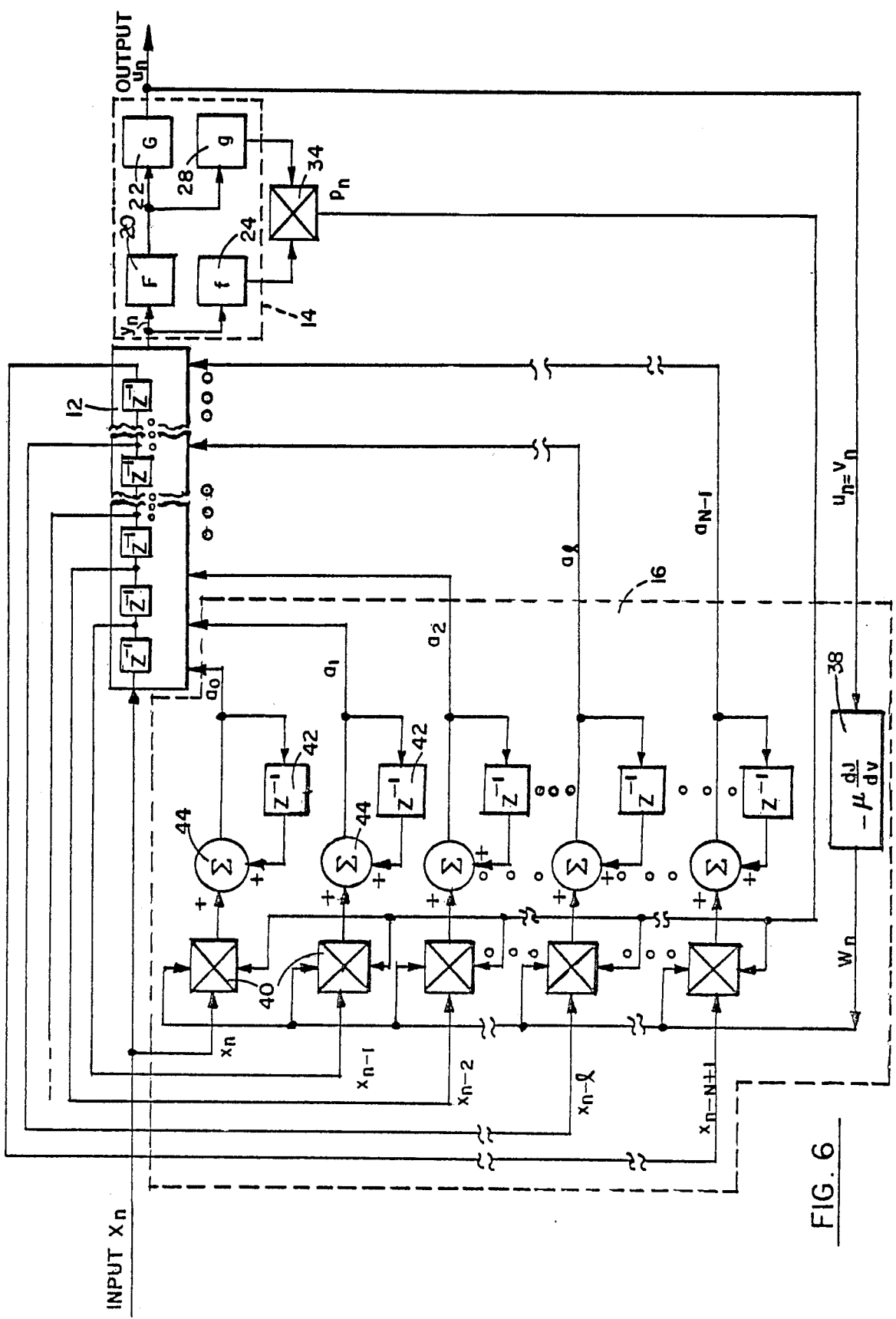
FIG. 6 shows a signal processor similar to a maximum entropy encoder, but in which the filter performs arbitrary shaping of the output amplitude-density functions and produces an output signal having a uniform power spectrum.

A third special case arises when the filter function H(z) is unitary, but the nonlinear signal-processor functions F(y) and G(e) are nontrivial. The resulting filter, shown in FIG. 6, bears some similarity to the maximum-entropy encoder, but includes arbitrary shaping of the output amplitude-density functions through the nonlinear processor G(e) 22. Because the filter function H(z) is unitary, the signal $v_n$ is the same as the output signal $u_n$. Also, the delayed values of the input signal $x_n$ may be obtained from within the adjustable linear filter 12, without the need for a separate input delay line in the parameter computer 16. The input signals $x_n, x_{n-1}, \ldots x_{(N-1)}$ from the delay line of the adjustable linear filter 12 may be supplied directly to the combiner 40 for combination with the signal $w_n$ and the signal $p_n$.

Figure 7:
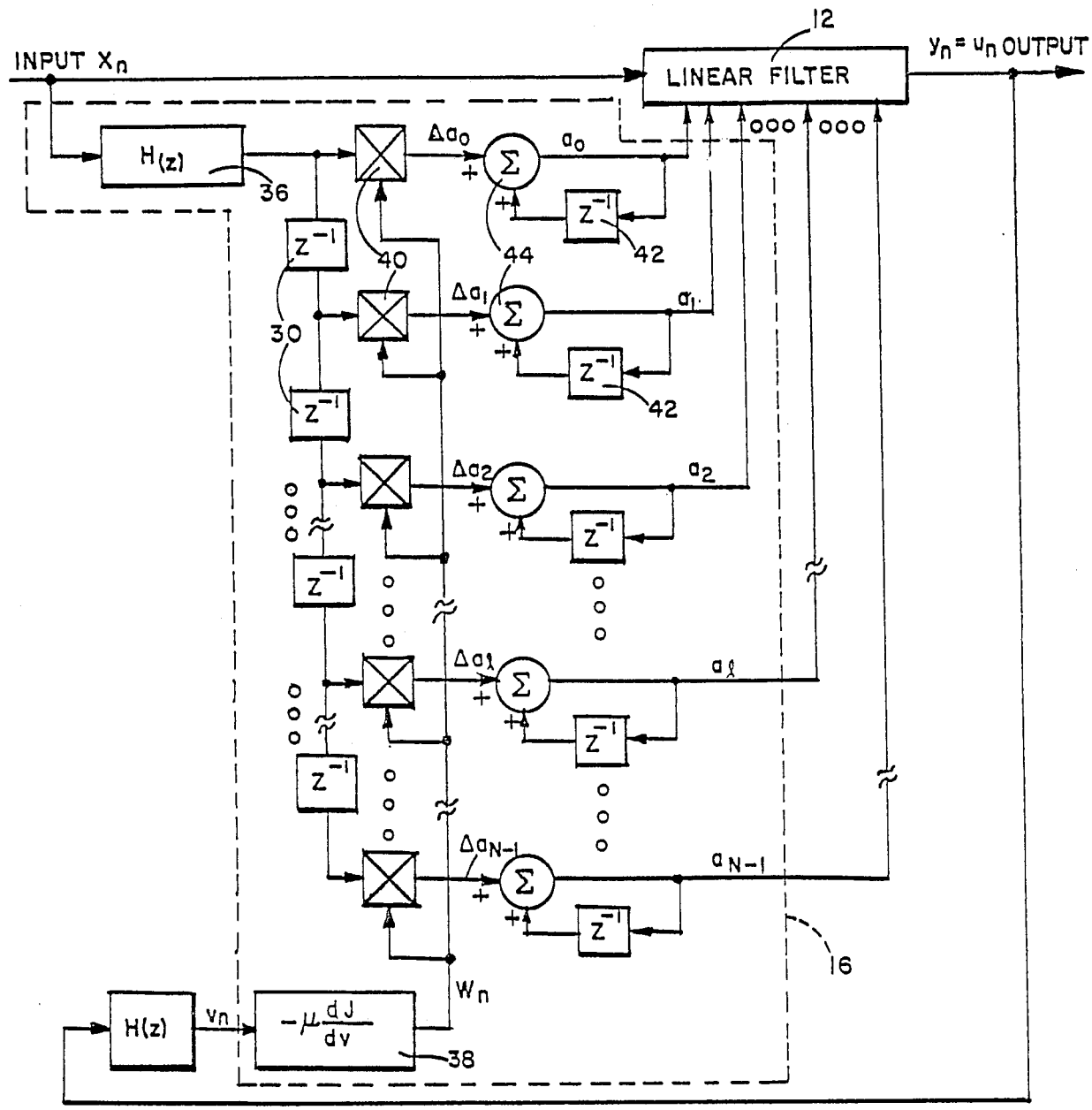
FIG. 7 is a block diagram of an adaptive spectrum-shaping filter derived from a signal processor constructed according to the invention when the nonlinear processor functions are unitary.

Another special case shows that the general signal processor of the invention reduces to a conventional linear filter when the two nonlinear processor functions F(y) and G(e) 20, 22 of the nonlinear signal processor 14 are both unitary, and the filter function H(z) is nontrivial. The resulting filter signal processor is shown in FIG. 7. With the unitary functions F(y) and G(e), no nonlinear amplitude shaping is required on the filter, and the output signal $u_n$ is the same as the output $y_n$ from the linear filter. Owing to the removal of the nonlinear functions and the control shaping multiplier $p_n$, all the filter element H(z) may be combined with the delay operators as described in U.S. Pat. No. 4,524,424, issued June 18, 1985 to S. A. White for an "Adaptive Spectrum Shaping Filter".

Figure 8:
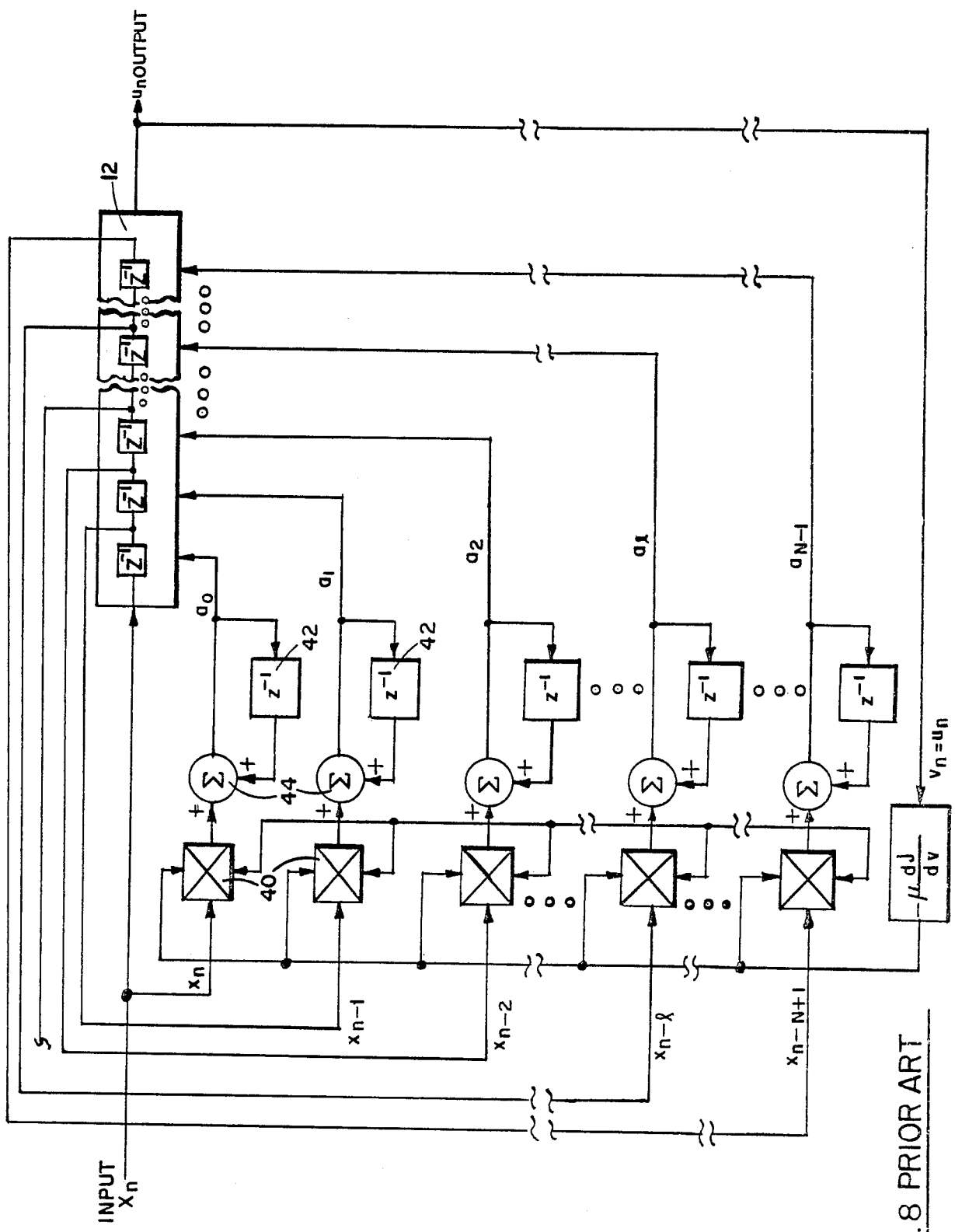
FIG. 8 is a block diagram of an adaptive predictive deconvolver formed from the signal-shaping processor of the invention when all the processor functions are unitary.

The final special case arises when all the functions F(y), G(e), H(z) are all unitary. In this case, the filter obtains the structure shown in FIG. 8, which is similar to the maximum-entropy encoder of FIG. 5. The signal processor of FIG. 8 is a classic adaptive predictive deconvolver.

I claim:

1. A signal processor comprising:

a nonlinear processor having an input and an output, wherein said nonlinear processor maps a sequence of first signal samples from said input into a sequence of second signal samples, each said second signal sample having a value representing the amplitude distribution function of the value of said corresponding first signal sample, each said second signal sample being mapped into a corresponding output signal sample, each output signal sample having an output signal value representing the inverse of the desired output amplitude-distribution function of each corresponding second signal sample; and, each first signal sample being mapped into a corresponding first control signal sample, each first control signal sample having a value representing the amplitude density function of the value of each corresponding first signal sample;

each second signal sample being mapped into a corresponding second control signal sample, each second control signal sample having a value representing the derivative of the inverse of the desired output amplitude-distribution function of the value of each respective second signal sample;

a combiner having first input responsive to said first control signal, a second input responsive to said second control signal and an output providing a corresponding gain control signal;

an adjustable linear filter having a sample signal input, a plurality of tap weight inputs and an output wherein:

the sample signal input of said adjustable linear filter is coupled to the input of the signal processor and receives sample input signals;

the output of said adjustable linear filter providing said sequence of first signal samples to said nonlinear processor input; and said adjustable linear filter being characterized to perform a predictive deconvolution on a signal applied to said linear filter input with respect to the spectrum-shaped output signal; and to provide said first signal to said nonlinear processor input;

a parameter computer having inputs coupled to the output of said nonlinear signal processor, to said combiner output and to the input to said adjustable linear filter, for computing the weights for said adjustable linear filter from said gain control signals, said sample input signals, and said output signal samples and for applying tap weight input signals to corresponding adjustable linear filter tap weight inputs.

2. The signal processor of claim 1 wherein said nonlinear processor comprises a first processor coupled to the output of said adjustable linear filter and responsive to said first signal sample for updating the contents of a first RAM to contain the amplitude distribution function of said first signal samples, said first RAM being addressed by each first signal sample to provide a corresponding second signal having a value corresponding to the amplitude distribution function of said first signal samples, said second signals having a uniform amplitude-density function.

3. The signal processor of claim 2 wherein said processor of said nonlinear processor additionally comprises a second RAM for storing the actual amplitude-density function of a signal input to said nonlinear processor, and wherein the output of said adjustable linear filter is read into said second memory.

4. A signal processor comprising:
a nonlinear signal processor having an input and an output, wherein said nonlinear signal processor maps a first signal from said input into a second signal having a desired amplitude-density function and applies said second signal to said nonlinear signal-processor output; and
an adjustable linear filter having an input and an output, wherein:
the output of said adjustable linear filter is coupled to the input of said nonlinear signal-processor; and
the input of said adjustable linear filter is coupled to the input of the signal processor; wherein:
said nonlinear signal processor comprises a processor coupled to the output of said adjustable linear filter for generating a signal having a uniform amplitude-density function;
said processor of said nonlinear signal processor comprises a first memory for storing the integral of the actual amplitude-distribution function of a signal input to said nonlinear signal processor, wherein said first memory is addressed by the output of said adjustable linear filter and said processor further comprises a second memory for storing the actual amplitude-density function of a signal input to said nonlinear signal processor wherein the output of said adjustable linear filter is read into said second memory; and
an output from said second memory is applied to said adjustable linear filter.

5. A signal processor comprising:
a nonlinear processor having an input and an output, wherein said nonlinear processor maps a first signal from said input into a second signal having a desired amplitude-density function and applies said second signal to said nonlinear processor output; and
an adjustable linear filter having an input and an output, wherein:
the output of said adjustable linear filter is coupled to the input of said nonlinear processor; and
the input of said adjustable linear filter is coupled to the input of the signal processor;
said nonlinear processor comprises a processor coupled to the output of said adjustable linear filter for generating a signal having a uniform amplitude-density function;
said processor of said nonlinear processor comprises a first RAM for storing the integral of the actual amplitude-density function of a signal input to said nonlinear processor, said first memory being addressed by the output of said adjustable linear filter, said nonlinear processor further comprising a second RAM for storing the actual amplitude-density function of a signal input to said nonlinear processor wherein the output of said adjustable linear filter is read into said second RAM;
an output from said second RAM is applied to said adjustable linear filter; and
said nonlinear processor additionally comprises a processor for applying the inverse of a desired output amplitude-distribution function.

6. The signal processor of claim 5 wherein said nonlinear processor additionally comprises a ROM coupled through the first RAM to be addressed by the input of said nonlinear processor, wherein said ROM is for storing the derivative of the inverse of the desired output amplitude-distribution function.

7. The signal processor of claim 6 wherein an output from said ROM is applied to said adjustable linear filter.

8. A signal processor comprising:
a nonlinear signal processor having an input and an output, wherein said nonlinear signal processor maps a first signal from said input into a second signal having a desired amplitude-density function and applies said second signal to said nonlinear signal-processor output; and
an adjustable linear filter having an input and an output, wherein:
the output of said adjustable linear filter is coupled to the input of said nonlinear signal-processor; and
the input of said adjustable linear filter is coupled to the input of the signal processor;
wherein said nonlinear signal processor comprises:
a first processor coupled to the output of said linear filter for generating a signal having a uniform amplitude-density function; and
a second processor coupled to the output of said first processor for applying the inverse of a desired output amplitude-distribution function, wherein the output of said second processor is coupled to said signal processor output.

9. The signal processor of claim 8 wherein:
said first processor comprises a memory for storing the actual amplitude-distribution function of a signal on the input of said non-linear signal processor;
said nonlinear signal processor additionally comprises a second memory for storing the actual amplitude-density function of said signal on the output of said adjustable linear filter;
said second processor comprises a third memory for storing the inverse of the desired amplitude-density function; and
said nonlinear filter additionally comprises a fourth memory for storing a derivative function of the function stored in said third memory.

10. The signal processor of claim 9 additionally comprising means for combining signals output from said second memory and said fourth memory, and for combining said combined signal with a signal input to said adjustable linear filter.

11. A signal processor having an input and an output comprising:
a nonlinear processor having an input and an output, and comprising:
a first processor for generating from an input signal an intermediate signal having a uniform amplitude-density function; and
a second processor for generating from said intermediate signal an output signal having a desired amplitude-density function;
an adjustable linear filter having an input responsive to a sequence of input signal samples at said signal processor input and an output, wherein said output of said adjustable linear filter is connected to the input of said nonlinear processor;

a processor responsive to said intermediate signal coupled to the output of said nonlinear processor for shaping the spectrum of a signal received from said nonlinear processor output to provide a spectrum shaped signal;

a parameter computer having a first input responsive to said input signal samples, a second input responsive to a first control signal obtained by mapping said intermediate signal through a function characterized as the derivative of the inverse of the desired output amplitude distribution function and a second control signal from said nonlinear processor output for adjusting the parameters of said adjustable linear filter, said parameter computer having:

a means for applying said spectrum shaped output signal to the parameters of said adjustable linear filter.

12. A nonlinear adaptive filter comprising:

a nonlinear filter having an input and an output, and comprising;

a first processor for generating from an input signal an intermediate signal having a uniform amplitude-density function; and a second processor for generating from said intermediate signal an output signal having a desired amplitude-density function;

an adjustable linear filter having an input and an output, wherein said output of said adjustable linear filter is connected to the input of said nonlinear filter;

a processor coupled to the output of said nonlinear filter for shaping the spectrum of a signal received from said nonlinear filter output; and a parameter computer for adjusting the parameters of said adjustable linear filter, said parameter computer comprising;

an input coupled to the output of said processor; and means for applying said spectrum shaped output signal to the parameters of said adjustable linear filter; and wherein said processor for shaping the spectrum of a signal received from the output of said nonlinear filter shapes said output signal into a signal having a uniform power spectrum.

13. The nonlinear adaptive filter of claim 12 wherein said spectrum shaping processor comprises a linear filter having a function H(z) coupled between the output of said nonlinear filter and the input of said parameter computer, wherein the function H(z) is related to the desired power spectrum of the output from the nonlinear filter $|D(\omega)|^2$ by $$|D(\omega)|^2 = |H(e^{j\omega T})|^{-2}.$$

14. A nonlinear adaptive filter comprising:

a nonlinear filter having an input and an output, and comprising:

a first processor for generating from an input signal an intermediate signal having a uniform amplitude-density function; and a second processor for generating from said intermediate signal an output signal having a desired amplitude-density function;

an adjustable linear filter having an input and an output, wherein said output of said adjustable linear filter is connected to the input of said nonlinear filter;

a processor coupled to the output of said nonlinear filter for shaping the spectrum of a signal received from said nonlinear filter output; and a parameter computer for adjusting the parameters of said adjustable linear filter, said parameter computer comprising;

an input coupled to the output of said processor; and means for applying said spectrum shaped output signal to the parameters of said adjustable linear filter; and wherein:

said first processor of said nonlinear filter comprises a RAM for storing the inverse of the amplitude-distribution function desired for the signal output from said nonlinear filter.

15. The nonlinear adaptive filter of claim 14 additionally comprising:

a second RAM connected to the input of said nonlinear filter for storing the actual amplitude-density function of the signal input to said nonlinear filter; and a second ROM connected to said first and second processors of said nonlinear filter to receive said intermediate signal, said second ROM for storing the derivative of said inverse of the desired amplitude-distribution function;

wherein the outputs of said second ROM and said second RAM are combined and applied to said parameter computer.

16. The nonlinear adaptive filter of claim 15 wherein said parameter computer additionally comprises:

a tapped delay line connected to the input of said adjustable linear filter, and a plurality of signal combiners, each for combining a tap output from said tapped delay line with the combined outputs from said second ROM and said second RAM.

17. The nonlinear adaptive filter of claim 16 wherein said parameter computer additionally comprises:

a plurality of second signal combiners, each for combining the output of one of said first signal combiners with the output of said processor for shaping the spectrum of a signal received from the output of said nonlinear filters.

18. The nonlinear adaptive filter of claim 17 wherein the output of each of said second signal combiners is the adjustment to a corresponding parameter of said adjustable linear filter.

* * * * *